United States Patent [19]
Matoba

[11] Patent Number: 5,953,281
[45] Date of Patent: Sep. 14, 1999

[54] SEMICONDUCTOR MEMORY DEVICE HAVING SWITCH TO SELECTIVELY CONNECT OUTPUT TERMINAL TO BIT LINES

[75] Inventor: Kenjiro Matoba, Miyazaki, Japan

[73] Assignee: Oki Electric Industry Co., Ltd., Tokyo, Japan

[21] Appl. No.: 09/050,969

[22] Filed: Mar. 31, 1998

[30] Foreign Application Priority Data

Aug. 5, 1997 [JP] Japan ................................. 9-210729

[51] Int. Cl.$^6$ ............................................. G11C 8/00
[52] U.S. Cl. .................. 365/230.05; 365/154; 365/156; 365/190
[58] Field of Search ................... 365/230.05, 189.04, 365/154, 156, 203, 190

[56] References Cited

U.S. PATENT DOCUMENTS

| | | | |
|---|---|---|---|
| 5,424,995 | 6/1995 | Miyazaki et al. | 365/230.05 |
| 5,774,393 | 6/1998 | Kuriyama | 365/156 |
| 5,774,410 | 6/1998 | Nakase | 365/230.05 |
| 5,812,469 | 9/1998 | Nadeau-Dostie et al. | 365/230.05 |

*Primary Examiner*—Son Mai
*Attorney, Agent, or Firm*—Jones Volentine, LLP

[57] ABSTRACT

A semiconductor memory device includes a pair of read address terminals which supplies first and second read addresses for outputting stored at a selected memory cell to one of a pair of bit lines, and a selector which selects one of the bit lines corresponding to whether a present reading is for the first read address or for the second read address, and which outputs a data read in the selected bit line to an output terminal. Accordingly, the semiconductor memory device can set a frequency of a signal applied to a precharge signal input terminal to a value which is lower than a conventional semiconductor memory device, and can improve the speed at which the data is read.

12 Claims, 6 Drawing Sheets

5,953,281

SEMICONDUCTOR MEMORY DEVICE HAVING SWITCH TO SELECTIVELY CONNECT OUTPUT TERMINAL TO BIT LINES

BACKGROUND OF THE INVENTION

1. Field of the Invention

The present invention generally relates to a semiconductor memory device, and more particularly, the present invention relates to a static random access memory (SRAM).

This application is a counterpart of Japanese application Serial Number 210729/1997, filed Aug. 5, 1997, the subject matter of which is incorporated herein by reference.

2. Description of the Related Art

The SRAM is classified as a volatile memory because it relies on the application of continuous power to maintain the stored data. If the power is interrupted, the memory contents are destroyed unless a back-up battery storage system is maintained. The SRAM output width ranges from 1 to 32 bits. Standard inputs and outputs include interfacing with CMOS, TTL, and ECL interface circuits. Power supply range includes standard 5 V and new 3.3 V standard for battery-powered applications. A SRAM is a matrix of static, volatile memory cells, and address decoding functions integrated on-chip to allow access to each cell for read/write functions. The semiconductor memory cells use active element feedback in the form of cross-coupled invertors to store a bit of information as a logic one or zero state. The active elements in a memory cell need a constant source of dc(or static) power to remain latched in the desired state. The memory cells are arranged in parallel so that all the data can be received or retrieved simultaneously.

SUMMARY OF THE INVENTION

An object of the present invention is to provide a semiconductor memory device that can set a frequency of a signal applied to a precharge signal input terminal to a value which is lower than that of a conventional semiconductor memory device, and which can improve the speed at which data is read.

According to one aspect of the present invention, for achieving the above object, there is provided a semiconductor memory device comprising first and second bit lines, plural memory cells connected between said first and second bit lines, plural pairs of read address terminals respectively connected to corresponding ones of said plural memory cells, each pair of read address terminals supplying respective first and second read address signals to each corresponding memory cell, said first read address signal enabling reading of said corresponding memory cell via said first bit line, and said second read address signal enabling reading of said corresponding memory cell via said second bit line, an output terminal, and a selector switch, connected to said first and second bit lines and said output terminal, which is responsive to a control input to selectively connect said output terminal to a corresponding one of said first and second bit lines for which reading of said memory cells has been enabled by said first and second address signals.

According to another aspect of the present invention, for achieving the above object, there is provided a semiconductor memory device comprising first and second bit lines, plural memory cells connected between said first and second bit lines, plural pairs of address terminals respectively connected to corresponding ones of said plural memory cells, each pair of address terminals supplying respective first and second read/write address signals to each corresponding memory cell, said first read/write address signal enabling reading and writing of said corresponding memory cell via said first bit line, and said second read/write address signal enabling reading and writing of said corresponding memory cell via said second bit line, an input terminal, a write control circuit, connect to said first and second bit lines and said input terminals, which selectively connects said input terminal to a corresponding one of said first and second bit lines for which writing of said memory cells has been enabled by said first and second address signals, an output terminal, and a selector switch, connected to said first and second bit lines and said output terminal, which is responsive to a control input to selectively connect said output terminal to a corresponding one of said first and second bit lines for which reading of said memory cells has been enabled by said first and second address signals.

BRIEF DESCRIPTION OF THE DRAWINGS

While the specification concludes claims particularly pointing out and distinctly claiming the subject matter that is regarded as the invention, the invention, along with the objects, features, and advantages thereof, will be better understood from the following description taken in connection with the accompanying drawings, in which:

DETAILED DESCRIPTION OF THE PREFERRED EMBODIMENTS

A semiconductor memory device according to a first preferred embodiment of the present invention will hereinafter be described in detail with reference to the accompanying drawings.

Figure 1:
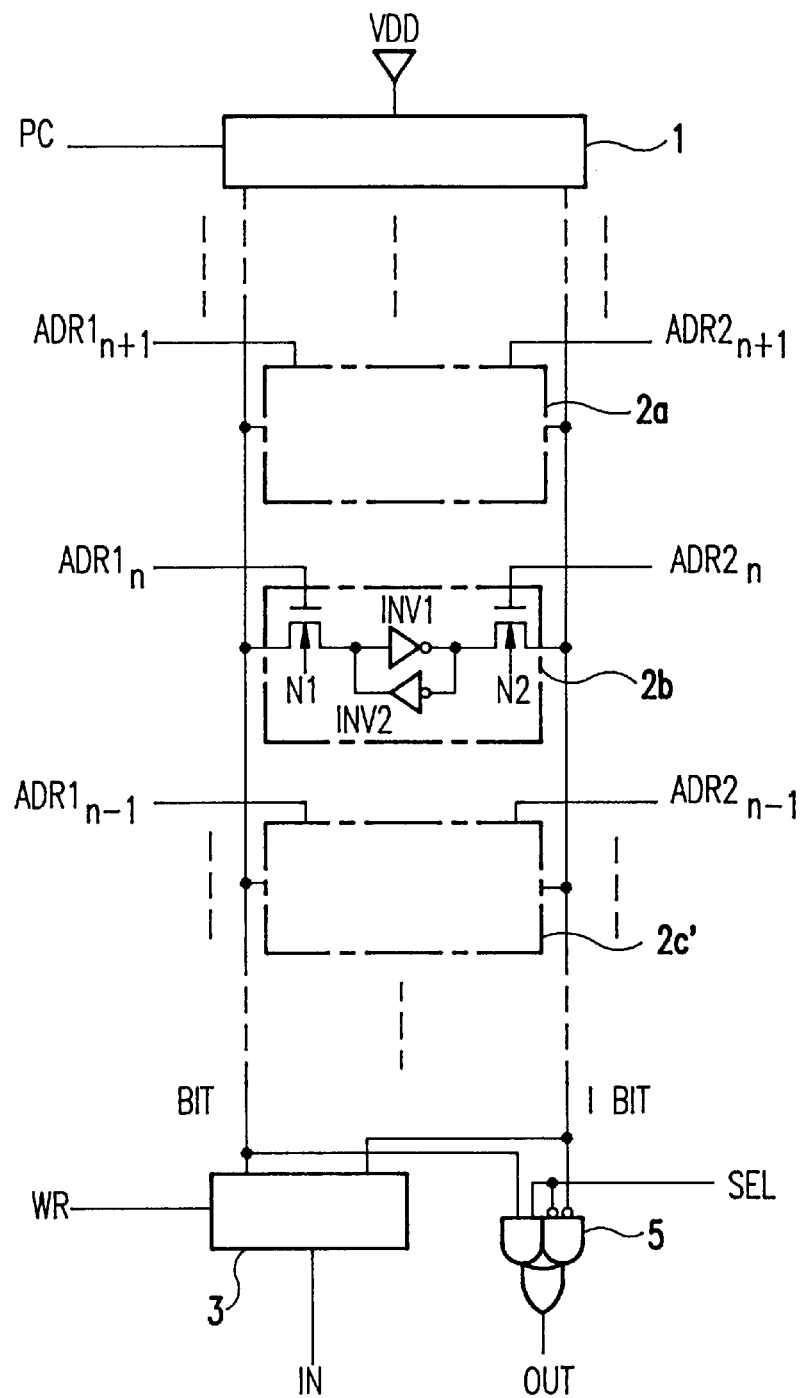
FIG. 1 is a schematic diagram showing a semiconductor memory device according to a first preferred embodiment of a present invention.

FIG. 1 is a schematic diagram showing a semiconductor memory device according to a first preferred embodiment of the present invention.

As shown in FIG. 1, an SRAM includes a precharge circuit 1 which precharges bit lines BIT and I BIT and which connects with a precharge signal input terminal PC, a plurality of memory cells 2a, 2b, 2c for storing data, a write control circuit 3 for controlling writing of data for a selected memory cell, and a selector 5.

The precharge circuit 1 maybe configured by a pair of P-channel transistors having gates connected with the precharge signal input terminal PC via an inverter, sources connected with a power terminal $V_{DD}$, and drains connected with the bit lines BIT and I BIT. The precharge circuit 1 precharges the bit lines BIT and I BIT when an H level is applied to the precharge signal input terminal PC. The pair of P-channel transistors of the precharge circuit 1 turn off when an L level is given to the precharge signal input terminal PC, and therefore the bit lines BIT and I BIT aren't electrically connected to the power terminal $V_{DD}$.

Each memory cell 2a, 2b, 2c is configured by flip-flop circuitry comprising N-channel transistors N1 and N2 and invertors INV1 and INV2. First address terminals $ADR1_{n+1}$, $ADR1_n$ and $ADR1_{n-1}$ are connected with respective gates of the respective transistors N1. Second address terminals $ADR2_{n+1}$, $ADR2_n$ and $ADR2_{n-1}$ are connected with respective gates of the respective transistors N2. Therefore, each memory cell 2a, 2b, 2c can be individually accessed via the respective transistors N1 and N2 corresponding to the first and second address terminals $ADR1_{n+1}$, $ADR1_n$, $ADR1_{n-1}$, $ADR2_{n+1}$, $ADR2_n$ and $ADR2_{n-1}$. Further, H and L levels complementally present on the bit lines BIT and I BIT corresponded to data stored in the selected memory cell when a potential applied to the precharge signal input terminal PC is at a H level.

The write control circuit 3 is connected with a write/read select signal input terminal WR, a data input terminal IN, and the bit lines BIT and I BIT. The write control circuit 3 complementally switches levels of the bit lines BIT and I BIT corresponding to a potential given to the data input terminal IN when writing data to one of the memory cells 2a, 2b, 2c is allowed.

The selector 5 is a combinational circuit of an AND gate, an NOR gate and an OR gate. The selector 5 is a circuit for selectively giving to the output terminal OUT, outputs of the respective memory cells 2a, 2b, 2c which are read through the bit lines BIT and I BIT. Logic states of the bit line BIT and a select terminal SEL are inputted to the AND gate. The inverse bit line I BIT and the select terminal SEL are inputted to the NOR gate. The outputs of the AND gate and the NOR gate are inputted to the OR gate and then its logical OR data is outputted to the output terminal OUT.

Reading operation of the semiconductor memory device according to the first preferred embodiment constructed as described above will now be described with reference to FIG. 2.

Figure 2:
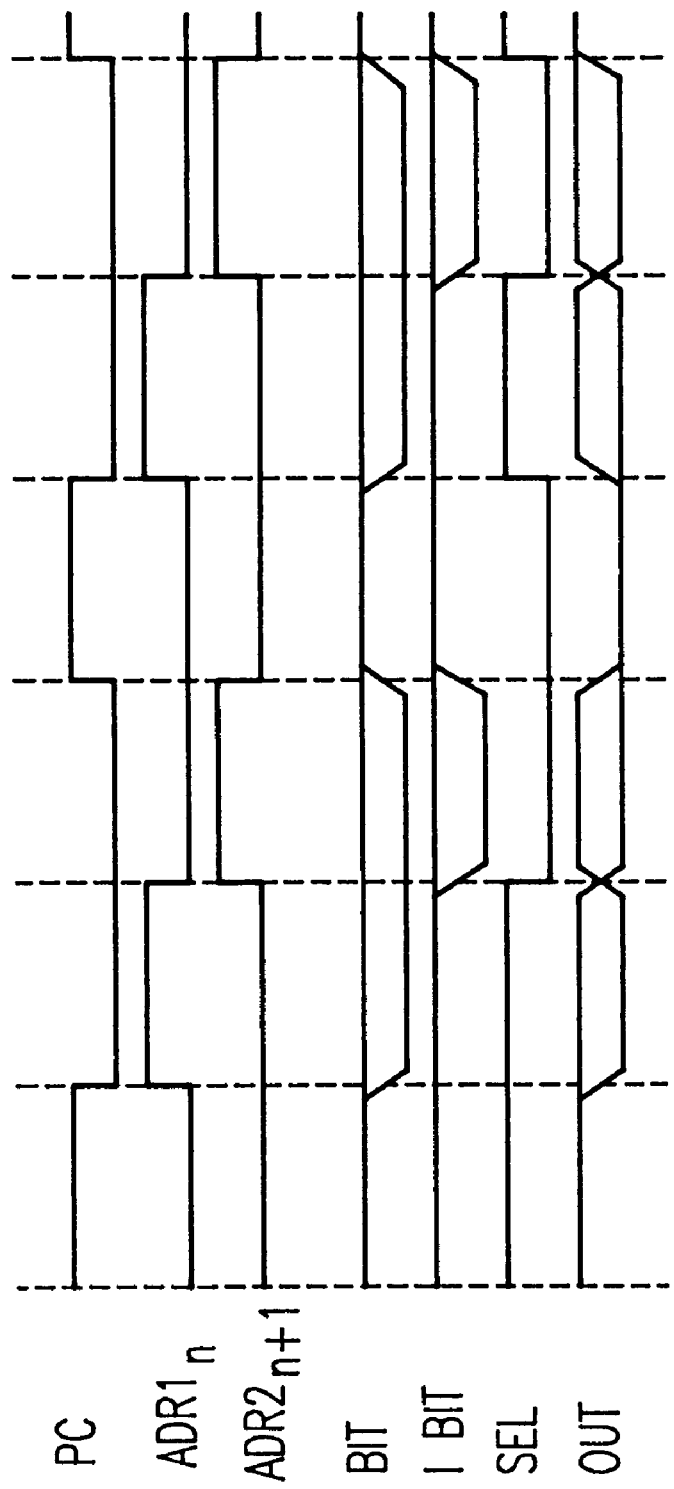
FIG. 2 is a timing chart showing a reading operation of a semiconductor memory device according to a first preferred embodiment of a present invention.

FIG. 2 is a timing chart showing a reading operation of a semiconductor memory device according to a first preferred embodiment of the present invention.

A precharge operation is as follows:

An H level is inputted to the precharge signal input terminal PC. As a result, the bit lines BIT and I BIT are set an H level ($V_{DD}$ level) by the precharged circuit 1. In this operation, an H level is output from the output terminal OUT when the select terminal SEL is an H level and an L level is output from the output terminal OUT when the select terminal SEL is an L level. Further, the first and second address terminals $ADR1_{n+1}$, $ADR1_n$ and $ADR1_{n-1}$, $ADR2_{n+1}$, $ADR2_n$ and $ADR2_{n-1}$ are set on an L level.

A first data reading operation is as follows:

Data is read from the bit lines BIT after the precharge operation. At this time, an L level is supplied to the precharge signal input terminal PC, and further an H level are supplied to selected first address terminals, for example $ADR1_n$ among the first address terminals $ADR1_{n+1}$, $ADR1_n$ and $ADR1_{n-1}$. As a result, the N-channel MOS transistor N1 in the memory cell 2b turns on, and data stored at the source of the N-channel MOS transistor N1 is read. The read data is output from the drain of the N-channel MOS transistor N1 to the AND gate through the bit line BIT. Here, the data read on the bit line BIT are outputted to the output terminal OUT if H level is given to the select terminal SEL. In this time, the inverse bit line I BIT maintains H level.

A second data reading operation is as follows: Reading operation of a data from a memory cell 2a is performed without a precharge operation after the data from the bit line BIT was read out. Therefore, an L level is applied to the selected first address terminal $ADR1_n$ and an H level is applied to a selected second address terminal, for example $ADR2_{n+1}$ of the second address terminals $ADR2_{n+1}$, $ADR2_n$ and $ADR2_{n-1}$. At this time, the precharge signal PC maintains an L level. As a result, the N-channel MOS transistor N2 in the selected memory cell 2b turns on, and data stored on the source of the N-channel MOS transistor N2 are read out, and the data are then given from the drain of the N-channel MOS transistor N2 to the NOR gate through the inverse bit line I BIT. Here, the inverse output of the data read out on the inverse bit line I BIT are outputted to the output terminal OUT if an L level is given to the select terminal SEL. At this time, the bit line BIT has maintained the data read out from the memory cell 2b.

The above-mentioned operations are one-cycle. After that, the cycle is repeated. In the first and second reading operations, the data stored in the memory cells are selectively read out from the desired address terminal.

As the mentioned above, the semiconductor memory device of the first preferred embodiment can read out the respective data from two memory cell once the precharge operation. Accordingly, the semiconductor memory device of the first preferred embodiment can set a frequency of a signal given to the precharge signal input terminal lower than a conventional semiconductor memory device, and can improve the velocity for reading out the data.

Further, if the bit lines BIT and I BIT have the same logic state during the first and second data reading operations, the semiconductor memory device of the first preferred embodiment can avoid the potential variation of the bit lines BIT and I BIT during the precharge operation next time. Accordingly, the semiconductor memory device of the first preferred embodiment can achieve a low power consumption.

A semiconductor memory device according to the second preferred embodiment of the present invention will hereinafter be described in detail with reference to the accompanying drawings.

Figure 3:
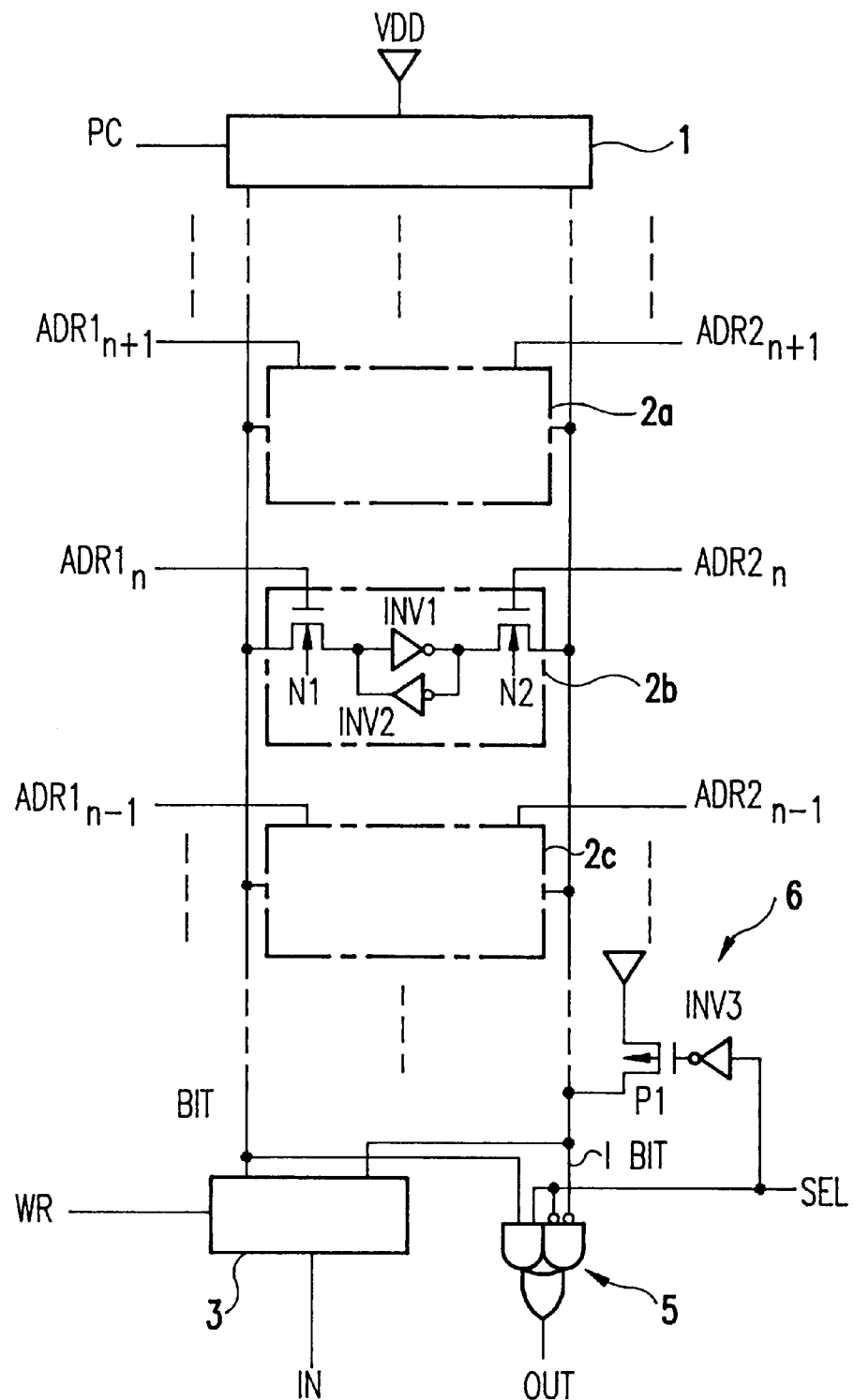
FIG. 3 is a schematic diagram showing a semiconductor memory device according to a second preferred embodiment of a present invention.

FIG. 3 is a schematic diagram showing a semiconductor memory device according to a second preferred embodiment of the present invention. As shown in FIG. 3, a feature of the second preferred embodiment is to include a high potential supply circuit 6 to fix an H level the potential of the inverse bit line I BIT. The high potential supply circuit 6 can avoid a potential drop of the inverse bit line I BIT.

The high potential supply circuit 6 includes an inverter INV3 connected to a select terminal SEL with an input terminal thereof and a P-channel MOS transistor P1 which operates by inputting an output of the inverter INV3. Here, a source of the P-channel MOS transistor P1 is connected with a power supply voltage $V_{DD}$, and a drain of the P-channel MOS transistor P1 is connected with the inverse bit line I BIT. Therefore, the power supply voltage $V_{DD}$ is given to the inverse bit line I BIT through the P-channel MOS transistor P1 when the P-channel MOS transistor P1 turned on.

Reading operation of the semiconductor memory device according to the second preferred embodiment constructed as described above will now be described with reference to FIG. 4.

Figure 4:
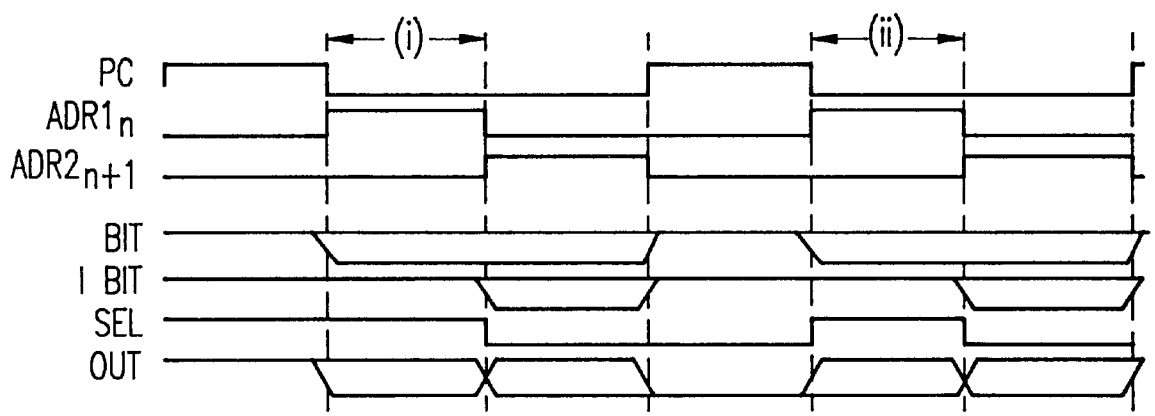
FIG. 4 is a timing chart showing a reading operation of a semiconductor memory device according to a second preferred embodiment of a present invention.

FIG. 4 is a timing chart showing a reading operation of a semiconductor memory device according to a second preferred embodiment of a present invention.

A precharge operation is as follows:

An H level is inputted to the precharge signal input terminal PC. As a result, the bit lines BIT and I BIT are set an H level ($V_{DD}$ level) by the precharged circuit 1. In this operation, an H level outputs from the output terminal OUT when the select terminal SEL is an H level and an L level outputs from the output terminal OUT when the select terminal SEL is L level. Further, the first and second address terminals $ADR1_{n+1}$, $ADR1_n$ and $ADR1_{n-1}$, $ADR2_{n+1}$, $ADR2_n$ and $ADR2_{n-1}$ are set on an L level.

A first data reading operation is as follows:

Data are read from the bit lines BIT after the precharge operation. At this time, an L level is supplied to the precharge signal input terminal PC, and further an H level is supplied to the selected first address terminal, for example $ADR1_n$ of the first address terminals $ADR1_{n+1}$, $ADR1_n$ and $ADR1_{n-1}$. As a result, the N-channel MOS transistor N1 in the memory cell 2b turns on, and data stored on the source of the N-channel MOS transistor N1 are read, and the data are given from the drain of the N-channel MOS transistor N1 to the AND gate through the bit line BIT.

Here, the data read on the bit line BIT are outputted to the output terminal OUT if an H level is given to the select terminal SEL. At this time, the inverse bit line I BIT maintains an H level. In this time, since a gate of the P-channel MOS transistor P1 is an L level, the P-channel MOS transistor P1 is in an ON state, and the level of the inverse bit line I BIT is fixed an H level.

A second data reading operation is as follows:

The level of the select terminal SEL is switched an L level. At this time, the precharge signal PC maintains an L level. As a result, an H level appears an output of the inverter INV3, and a P-channel MOS transistor P1 then turns off. Therefore, a logic state of the inverse bit line I BIT maintains H level, but the fixed state is canceled. Then, an L level is applied to the selected first address terminal $ADR1_n$ and an H level is applied to the selected second address terminal, for example $ADR2_{n+1}$ of the second address terminals $ADR2_{n+1}$, $ADR2_n$ and $ADR2_{n-1}$. As a result, the inverse data stored in the selected memory cell 2b is read out the NOR gate through the inverse bit line I BIT. Here, the inverse output of the data read out on the inverse bit line I BIT are outputted to the output terminal OUT if an L level is given to the select terminal SEL. At this time, the bit line BIT has maintained the data read out from the memory cell 2b.

The above-mentioned operations are one-cycle. After that, the cycle is repeated. In the first and second reading operations, the data stored in the memory cells are selectively read out from the desired address terminal.

As the mentioned above, since the second preferred embodiment of the present invention includes a high potential supply circuit to fix an H level the potential of the inverse bit line I BIT during the first data reading operation (period as shown in (i), (ii) of FIG. 4), it can avoid a potential drop of the inverse bit line I BIT. As a result, the second preferred embodiment of the present invention can avoid current flows in the selector 5.

Accordingly, the semiconductor memory device of the second preferred embodiment can achieve a low power consumption, and can avoid a malfunction caused by a potential drop of the inverse bit line I BIT.

A semiconductor memory device according to the third preferred embodiment of the present invention will hereinafter be described in detail with reference to the accompanying drawings.

Figure 5:
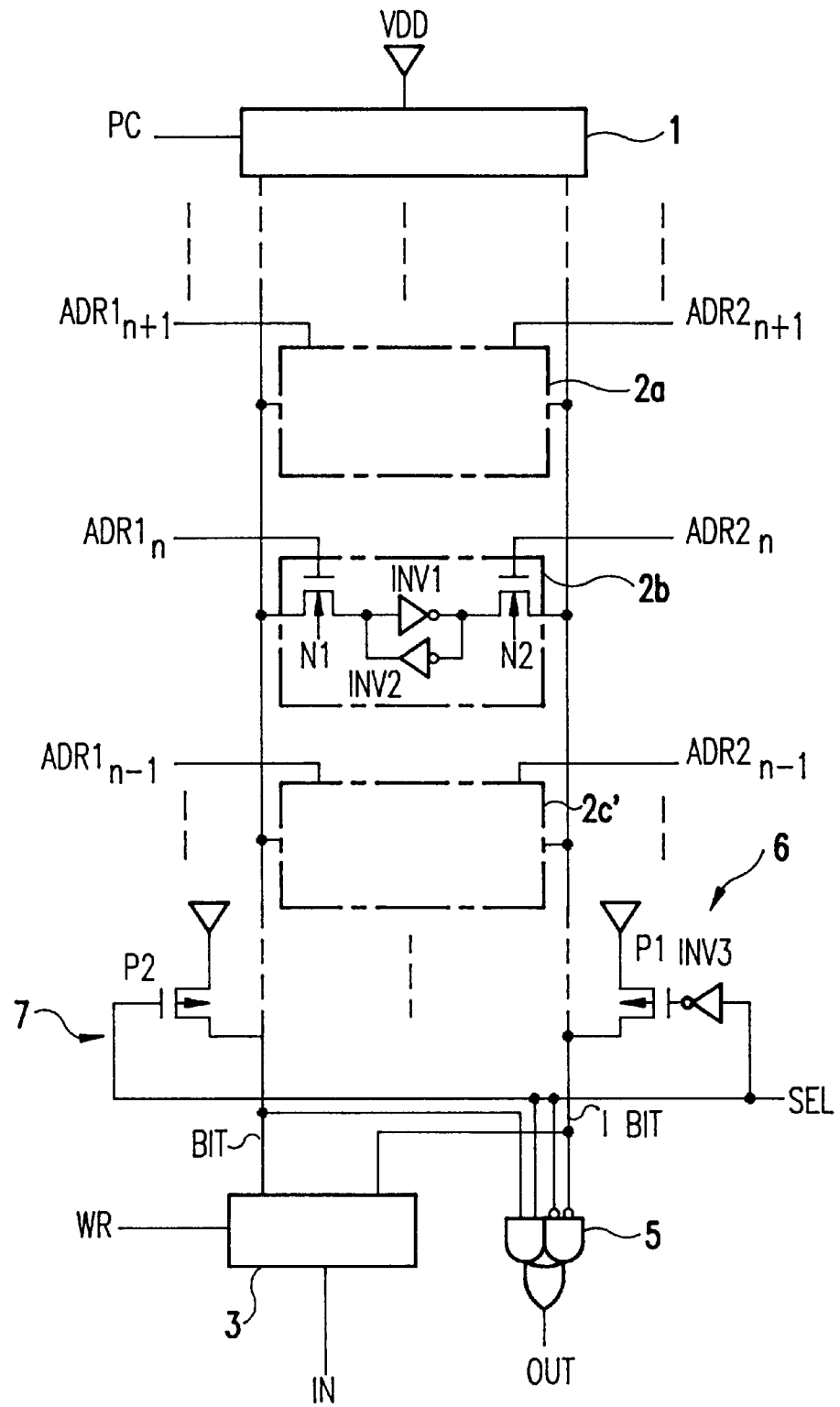
FIG. 5 is a schematic diagram showing a semiconductor memory device according to a third preferred embodiment of a present invention.

FIG. 5 is a schematic diagram showing a semiconductor memory device according to a third preferred embodiment of a present invention.

As shown in FIG. 5, a feature of the third preferred embodiment of a present invention is to include a writing dedicated precharge circuit 11 instead of the precharge circuit of the first and second preferred embodiments, and first and second high potential supply circuits 6, 7 respectively connected with bit lines BIT and I BIT and which perform a precharge operation when reading operations are performed.

The writing dedicated precharge circuit 11 applies H level to the bit lines BIT and I BIT only when data are wrote to memory cells 2a, 2b, 2c.

The first high potential supply circuit 6 is a similar to that of the second preferred embodiment.

The second high potential supply circuit 7 includes a P-channel MOS transistor P2 connected a select terminal SEL with a gate thereof. Here, a source of the P-channel MOS transistor P2 is connected with a power supply voltage $V_{DD}$, and a drain of the P-channel MOS transistor P1 is connected with the bit line BIT. Therefore, the power supply voltage $V_{DD}$ is applied to the bit line BIT through the P-channel MOS transistor P2 when the P-channel MOS transistor P2 turned on.

Reading operation of the semiconductor memory device according to the third preferred embodiment constructed as described above will now be described with reference to FIG. 6.

Figure 6:
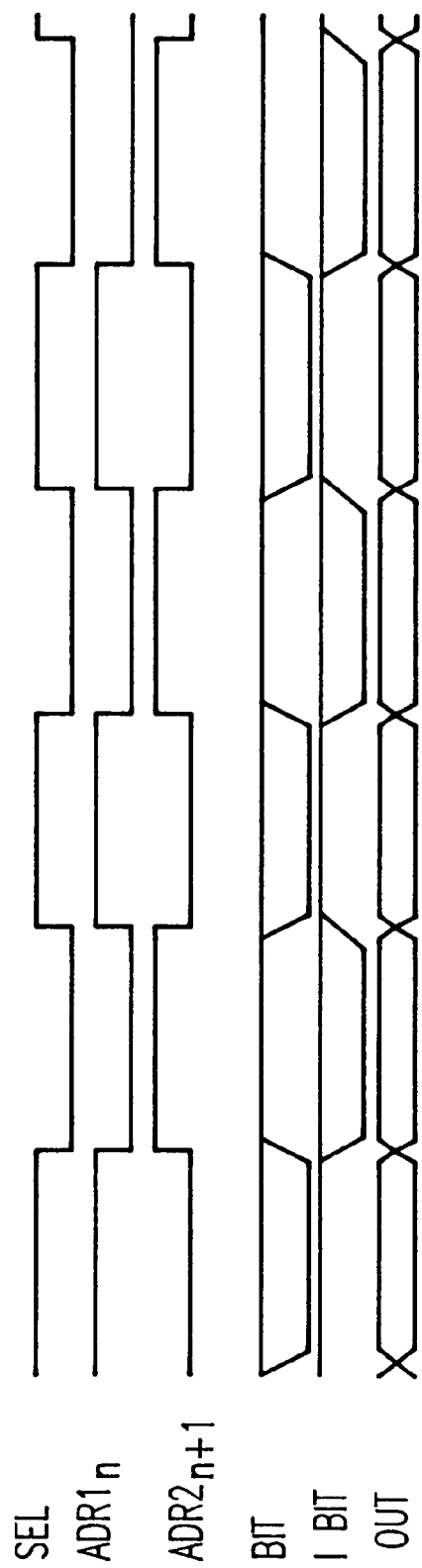
FIG. 6 is a timing chart showing a reading operation of a semiconductor memory device according to a third preferred embodiment of a present invention.

FIG. 6 is a timing chart showing a reading operation of a semiconductor memory device according to a third preferred embodiment of a present invention.

A precharge-cum-a first data reading operation is as follow as:

This operation is performed when H level is applied to the select terminal SEL.

When an H level is applied to the select terminal SEL, an output of an inverter INV3 is L level and the P-channel MOS transistor P1 then turns on. As a result, the inverse bit line I BIT is precharged to an H level ($V_{DD}$ Level) by the first high potential apply circuit 6. P-channel MOS transistor P2 turns off by applying H level to the select terminal SEL. As a result, the precharge operation to the bit line BIT is canceled.

In this circumstances, data stored in the selected memory cell 2b read out through the bit line BIT by applying an H level to first address terminals ADR1 and by applying an L level to second address terminals ADR2. The data are then given to a AND gate. At this time, since H level is applied to the select terminal SEL, data read out the bit line BIT is outputted a output terminal OUT.

A precharge-cum-a second data reading operation is as follow as:

This operation is performed when an L level is applied to the select terminal SEL.

When an L level is applied to the select terminal SEL, a output of an inverter INV3 is an H level and the P-channel MOS transistor P1 then turns off. As a result, the precharge operation to the inverse bit line I BIT is canceled. P-channel MOS transistor P2 turns on by applying an L level to the select terminal SEL and the bit line BIT is precharged by the second high potential apply circuit 7.

In this circumstances, inverse outputs of data stored in the selected memory cell 2a read out through the inverse bit line I BIT by applying an L level to first address terminals ADR1 and by applying H level to second address terminals ADR2. The data are then given to the AND gate. At this time, since an L level is applied to the select terminal SEL, data read from the inverse bit line BIT is outputted a output terminal OUT.

The above-mentioned operations are one-cycle. After that, the cycle is repeated. In the operations, the data stored in the memory cells are selectively read out from the desired address terminal.

As the mentioned above, the semiconductor memory device of the third preferred embodiment can read out data of a desired address from one of the bit lines BIT and I BIT during precharging of the other of the bit lines BIT and I BIT. Further, since the semiconductor memory device of the third preferred embodiment has nothing but a status of a potential appeared on the bit lines BIT and I BIT at one-cycle from a precharge operation to a data reading operation is two kind, it can the status of a potential longer than the first and second preferred embodiments. Therefore, the third preferred embodiment can be long a period for reading out data. Accordingly, the third preferred embodiment can achieve a low power consumption.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor memory device comprising:
   first and second bit lines;
   plural memory cells connected between said first and second bit lines;
   plural pairs of read address terminals respectively connected to corresponding ones of said plural memory cells, each pair of read address terminals supplying respective first and second read address signals to each corresponding memory cell, said first read address signal enabling reading of said corresponding memory cell via said first bit line, and said second read address signal enabling reading of said corresponding memory cell via said second bit line;
   an output terminal;
   a selector switch, connected to said first and second bit lines and said output terminal, which is responsive to a control input to selectively connect said output terminal to a corresponding one of said first and second bit lines for which reading of said memory cells has been enabled by said first and second address signals; and
   a high-level potential supply circuit which holds said second bit line at a high-level potential during a first reading operation via said first bit line, wherein the first reading operation is executed between a precharge operation and a second reading operation via said second bit line.

2. A semiconductor memory as claimed in claim 1, wherein said second bit line is an inverse bit line.

3. A semiconductor memory as claimed in claim 1, wherein said high-level potential supply circuit comprises an invertor having an input coupled with the control input to said selector, and a transistor which supplies said high-level potential and has a gate coupled with an output of said invertor.

4. A semiconductor memory device comprising:
   first and second bit lines;
   plural memory cells connected between said first and second bit lines;
   plural pairs of read address terminals respectively connected to corresponding ones of said plural memory cells, each pair of read address terminals supplying respective first and second read address signals to each corresponding memory cell, said first read address signal enabling reading of said corresponding memory cell via said first bit line, and said second read address signal enabling reading of said corresponding memory cell via said second bit line;
   an output terminal;
   a selector switch, connected to said first and second bit lines and said output terminal, which is responsive to a control input to selectively connect said output terminal to a corresponding one of said first and second bit lines for which reading of said memory cells has been enabled by said first and second address signals; and
   a first high-level potential supply circuit which holds said second bit line at a high-level potential during a first reading operation via said first bit line, and a second high-level potential supply circuit which holds said first bit line at the high-level potential during a second reading operation via said second bit line.

5. A semiconductor memory as claimed in claim 4, wherein said first high-level potential supply circuit comprises an invertor having an input coupled with the control input to said selector, and a first transistor which supplies said high-level potential to said second bit line and has a first gate coupled with an output of said invertor, and wherein said second high-level potential supply circuit comprises a second transistor which supplies said high-level potential to said first bit line and has a second gate coupled with the control input to said selector.

6. A semiconductor memory device comprising:
   first and second bit lines;
   plural memory cells connected between said first and second bit lines;
   plural pairs of read address terminals respectively connected to corresponding ones of said plural memory cells, each pair of read address terminals supplying respective first and second read address signals to each corresponding memory cell, said first read address signal enabling reading of said corresponding memory cell via said first bit line, and said second read address signal enabling reading of said corresponding memory cell via said second bit line;
   an output terminal; and
   a selector switch, connected to said first and second bit lines and said output terminal, which is responsive to a control input to selectively connect said output terminal to a corresponding one of said first and second bit lines for which reading of said memory cells has been enabled by said first and second address signals;
   wherein said selector is a logic circuit comprising an AND gage, a NOR gate and an OR gate.

7. A semiconductor memory device comprising:
   first and second bit lines;
   plural memory cells connected between said first and second bit lines;

plural pairs of address terminals respectively connected to corresponding ones of said plural memory cells, each pair of address terminals supplying respective first and second read/write address signals to each corresponding memory cell, said first read/write address signal enabling reading and writing of said corresponding memory cell via said first bit line, and said second read/write address signal enabling reading and writing of said corresponding memory cell via said second bit line;

an input terminal;

a write control circuit, connected to said first and second bit lines and said input terminal, which selectively connects said input terminal to a corresponding one of said first and second bit lines for which writing of said memory cells has been enabled by said first and second read/write address signals;

an output terminal;

a selector switch, connected to said first and second bit lines and said output terminal, which is responsive to a control input to selectively connect said output terminal to a corresponding one of said first and second bit lines for which reading of said memory cells has been enabled by said first and second address signals; and a high-level potential supply circuit which holds said second bit line at a high-level potential during a first reading operation via said first bit line, wherein the first reading operation is executed between a precharge operation and a second reading operation via said second bit line.

8. A semiconductor memory as claimed in claim 7, wherein said second bit line is an inverse bit line.

9. A semiconductor memory as claimed in claim 7, wherein said high-level potential supply circuit comprises an invertor having an input coupled with the control input to said selector, and a transistor which supplies said high-level potential and has a gate coupled with an output of said invertor.

10. A semiconductor memory device comprising:

first and second bit lines;

plural memory cells connected between said first and second bit lines;

plural pairs of address terminals respectively connected to corresponding ones of said plural memory cells, each pair of address terminals supplying respective first and second read/write address signals to each corresponding memory cell, said first read/write address signal enabling reading and writing of said corresponding memory cell via said first bit line, and said second read/write address signal enabling reading and writing of said corresponding memory cell via said second bit line;

an input terminal;

a write control circuit, connected to said first and second bit lines and said input terminal, which selectively connects said input terminal to a corresponding one of said first and second bit lines for which writing of said memory cells has been enabled by said first and second read/write address signals;

an output terminal;

a selector switch, connected to said first and second bit lines and said output terminal, which is responsive to a control input to selectively connect said output terminal to a corresponding one of said first and second bit lines for which reading of said memory cells has been enabled by said first and second address signals; and a first high-level potential supply circuit which holds said second bit line at a high-level potential during a first reading operation via said first bit line, and a second high-level potential supply circuit which holds said first bit line at the high-level potential during a second reading operation via said second bit line.

11. A semiconductor memory as claimed in claim 10, wherein said first high-level potential supply circuit comprises an invertor having an input coupled with the control input to said selector, and a first transistor which supplies said high-level potential to said second bit line and has a first gate coupled with an output of said invertor, and wherein said second high-level potential supply circuit comprises a second transistor which supplies said high-level potential to said first bit line and has a second gate coupled with the control input to said selector.

12. A semiconductor memory device comprising:

first and second bit lines;

plural memory cells connected between said first and second bit lines;

plural pairs of address terminals respectively connected to corresponding ones of said plural memory cells, each pair of address terminals supplying respective first and second read/write address signals to each corresponding memory cell, said first read/write address signal enabling reading and writing of said corresponding memory cell via said first bit line, and said second read/write address signal enabling reading and writing of said corresponding memory cell via said second bit line;

an input terminal;

a write control circuit, connected to said first and second bit lines and said input terminal, which selectively connects said input terminal to a corresponding one of said first and second bit lines for which writing of said memory cells has been enabled by said first and second read/write address signals;

an output terminal; and a selector switch, connected to said first and second bit lines and said output terminal, which is responsive to a control input to selectively connect said output terminal to a corresponding one of said first and second bit lines for which reading of said memory cells has been enabled by said first and second address signals;

wherein said selector is a logic circuit comprising an AND gage, a NOR gate and an OR gate.

* * * * *